United States Patent
Chen et al.

(10) Patent No.: US 9,041,153 B2
(45) Date of Patent: May 26, 2015

(54) MIM CAPACITOR HAVING A LOCAL INTERCONNECT METAL ELECTRODE AND RELATED STRUCTURE

(75) Inventors: Xiangdong Chen, Irvine, CA (US); Henry Kuo-Shun Chen, Irvine, CA (US); Wei Xia, Irvine, CA (US); Bruce Chih-Chieh Shen, Irvine, CA (US)

(73) Assignee: BROADCOM CORPORATION, Irvine, CA (US)

( * ) Notice: Subject to any disclaimer, the term of this patent is extended or adjusted under 35 U.S.C. 154(b) by 0 days.

(21) Appl. No.: 13/248,823

(22) Filed: Sep. 29, 2011

(65) Prior Publication Data
US 2013/0082351 A1    Apr. 4, 2013

(51) Int. Cl.
*H01L 29/92* (2006.01)
*H01L 23/522* (2006.01)
*H01L 49/02* (2006.01)

(52) U.S. Cl.
CPC ............ *H01L 23/5223* (2013.01); *H01L 28/60* (2013.01)

(58) Field of Classification Search
USPC .................. 257/532, 295–300, 303, 306–308
See application file for complete search history.

(56) References Cited

U.S. PATENT DOCUMENTS

| | | | | |
|---|---|---|---|---|
| 5,079,670 | A * | 1/1992 | Tigelaar et al. | 361/313 |
| 6,239,010 | B1 * | 5/2001 | Lu | 438/592 |
| 6,246,084 | B1 * | 6/2001 | Kim | 257/296 |
| 7,078,310 | B1 * | 7/2006 | Kar-Roy et al. | 438/396 |
| 8,125,049 | B2 * | 2/2012 | Coolbaugh et al. | 257/532 |
| 2011/0031585 | A1 * | 2/2011 | Xia et al. | 257/532 |
| 2011/0115005 | A1 | 5/2011 | Coolbaugh et al. | |

OTHER PUBLICATIONS

Office Action mailed Oct. 22, 2014, in Chinese Patent Application No. 201210365768.X.

\* cited by examiner

*Primary Examiner* — Thanh T Nguyen
(74) *Attorney, Agent, or Firm* — Oblon, McClelland, Maier & Neustadt, L.L.P.

(57) ABSTRACT

According to one exemplary embodiment, a method for fabricating a metal-insulator-metal (MIM) capacitor in a semiconductor die comprises forming a bottom capacitor electrode over a device layer situated below a first metallization layer of the semiconductor die, and forming a top capacitor electrode over an interlayer barrier dielectric formed over the bottom capacitor electrode. The top capacitor electrode is formed from a local interconnect metal for connecting devices formed in the device layer. In one embodiment, the bottom capacitor electrode is formed from a gate metal. The method may further comprise forming a metal plate in the first metallization layer and over the top capacitor electrode, and connecting the metal plate to the bottom capacitor electrode to provide increased capacitance density.

10 Claims, 5 Drawing Sheets

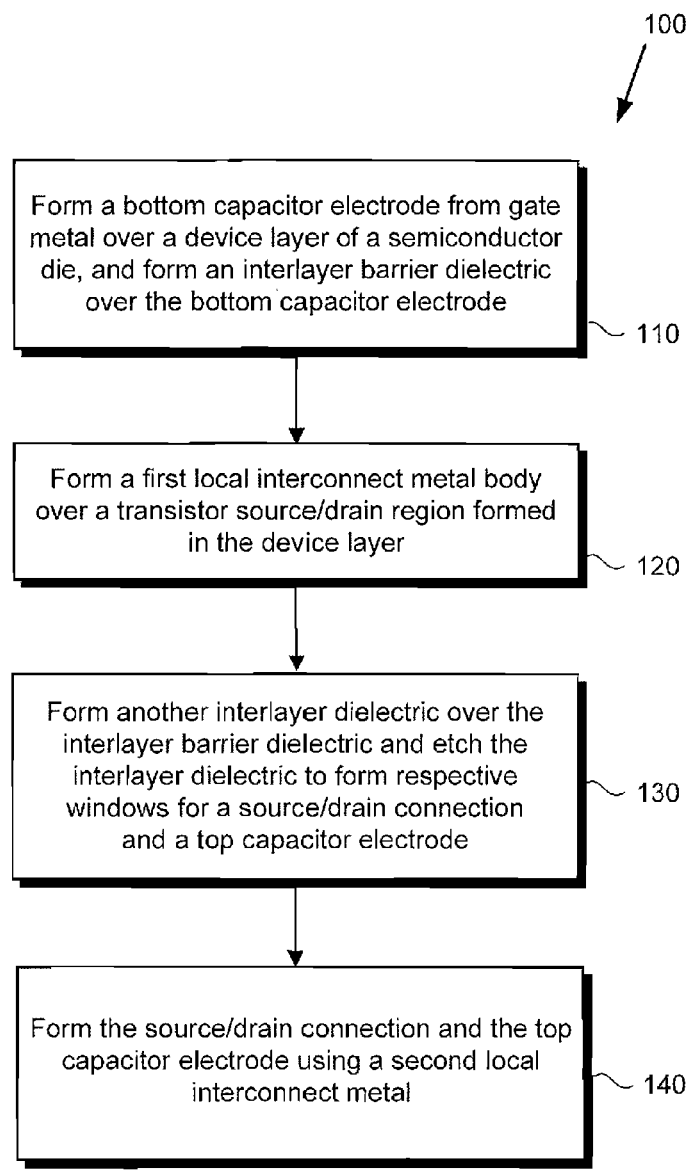

MIM CAPACITOR HAVING A LOCAL INTERCONNECT METAL ELECTRODE AND RELATED STRUCTURE

BACKGROUND OF THE INVENTION

1. Field of the Invention

The present invention is generally in the field of semiconductors. More particularly, the invention is in the field of fabrication of capacitors in semiconductor dies.

2. Background Art

Metal-insulator-metal (MIM) capacitors have been used extensively in the fabrication of integrated analog and mixed signal circuits on semiconductor dies. A MIM capacitor typically includes a MIM capacitor dielectric situated between bottom and top metal plates, which form the electrodes of the MIM capacitor. Conventionally, MIM capacitors are fabricated on semiconductor dies during back-end-of-line (BEOL) processing.

A conventional MIM capacitor can be fabricated, for example, by using specialized metal layers for bottom and top MIM capacitor electrodes, and typically utilizes a specialized dielectric layer as the MIM capacitor dielectric between the top and bottom electrodes. In the conventional approach, MIM capacitors are fabricated in the otherwise unused space available between metallization layers in a semiconductor die, during BEOL processing. However, use of the specialized dielectric and metal layers required to form the MIM capacitor dielectric and the bottom and top MIM capacitor electrodes during BEOL processing can require multiple process steps and masks beyond those typically used in complementary metal-oxide-semiconductor (CMOS) process flows, which can undesirably increase manufacturing cost. Moreover, although it is desirable in principle to fabricate MIM capacitors having a high capacitance density, placing such MIM capacitors between metallization layers situated over the device layer in which active devices are formed can adversely affect device performance, such as the speed of CMOS logic devices, for example.

Thus, there is a need to overcome the drawbacks and deficiencies in the conventional art by providing a MIM capacitor capable of achieving a higher capacitance density while being compatible with standard CMOS fabrication materials and process flows.

SUMMARY OF THE INVENTION

The present application is directed to a method for fabricating a metal-insulator-metal (MIM) capacitor having a local interconnect metal electrode and related structure, substantially as shown in and/or described in connection with at least one of the figures, as set forth more completely in the claims.

BRIEF DESCRIPTION OF THE DRAWINGS

FIG. 1 is a flowchart showing a method, according to one embodiment of the present invention, for fabricating a metal-insulator-metal (MIM) capacitor having a local interconnect metal electrode.

DETAILED DESCRIPTION OF THE INVENTION

Figure 2A:
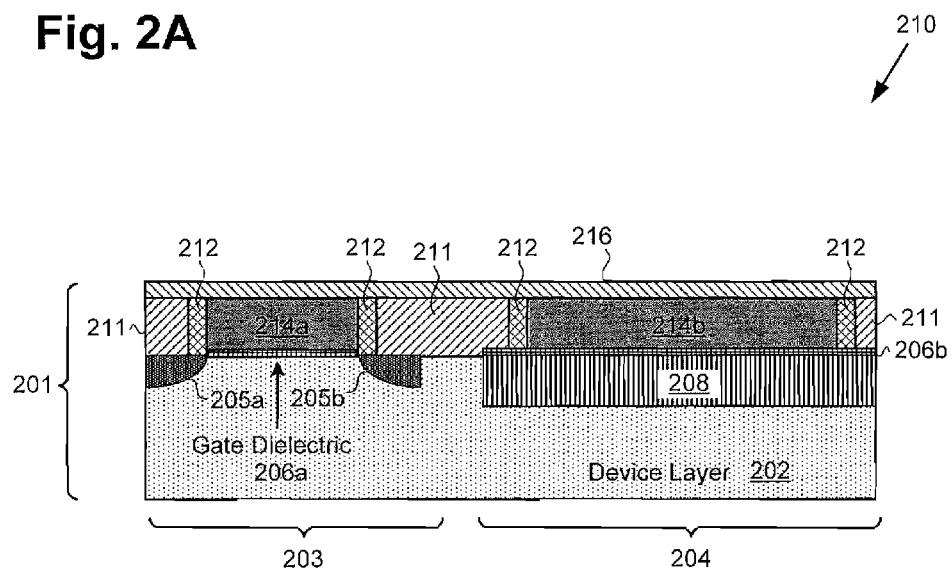
FIG. 2A shows a cross-sectional view, which includes a portion of a semiconductor die processed according to an embodiment of the present invention, corresponding to an initial step in the flowchart in FIG. 1.

The present application is directed to a method for fabricating a metal-insulator-metal (MIM) capacitor having a local interconnect metal electrode and related structure. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely example embodiments of the invention. To maintain brevity, other embodiments of the invention, which use the principles of the present invention, are not specifically described in the present application and are not specifically illustrated by the present drawings. It should be borne in mind that, unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 shows flowchart 100 of a method, according to one embodiment of the present invention, for fabricating a MIM capacitor having a local interconnect metal electrode. Certain details and features have been left out of flowchart 100 that are apparent to a person of ordinary skill in the art. For example, a step may consist of one or more substeps or may involve specialized equipment or materials, as known in the art. Steps 110 through 140 indicated in flowchart 100 are sufficient to describe one embodiment of the present invention; however, other embodiments of the invention may utilize steps different from those shown in flowchart 100, and may include more, or fewer, steps. It is noted that the processing steps shown in flowchart 100 are performed on a portion of processed semiconductor die, which, prior to step 110, may include, among other features, a substrate, such as a group IV semiconductor substrate, a device layer, such as a layer comprising silicon or germanium formed over the substrate, and isolation regions, such as shallow trench isolation (STI) regions.

Structures 210 through 240, shown respectively in FIGS. 2A through 2D, illustrate the result of performing steps 110 through 140 of flowchart 100, respectively. For example, structure 210 shows a semiconductor structure after processing step 110, structure 220 shows structure 210 after the processing of step 120, structure 230 shows structure 220 after the processing of step 130, and structure 240 shows structure 230 after the processing of step 140.

Referring now to FIG. 2A, structure 210 of FIG. 2A shows a portion of semiconductor die 201 including device layer 202, after completion of step 110 of flowchart 100, in FIG. 1. In semiconductor die 201, device layer 202, which can be an epitaxial layer comprising silicon or germanium, for example, includes field-effect transistor (FET) region 203 and MIM capacitor region 204. FET region 203 and MIM capacitor region 204 are regions of device layer 202 that are designated for FET and MIM capacitor formation, respectively. As shown in FIG. 2A, according to the present embodiment, FET region 203 of device layer 202 includes source/drain regions 205a and 205b, while MIM capacitor region 204 includes isolation region 208, which can be, for example, an STI region formed in device layer 202. Isolation region 208 can comprise silicon oxide ($SiO_2$) or any other suitable dielectric material for formation of isolation region 208.

Figure 2E:
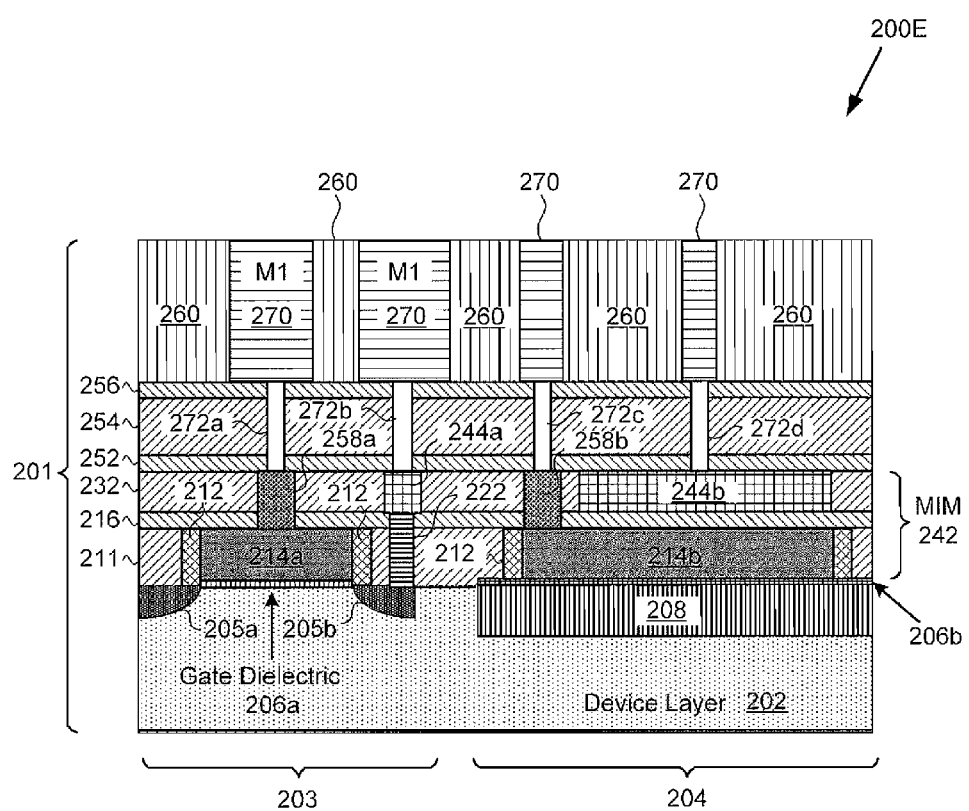
FIG. 2E shows a cross-sectional view of a semiconductor die including a MIM capacitor having a local interconnect metal electrode, according to one embodiment of the present invention, after formation and patterning of a first metallization layer.
Figure 3:
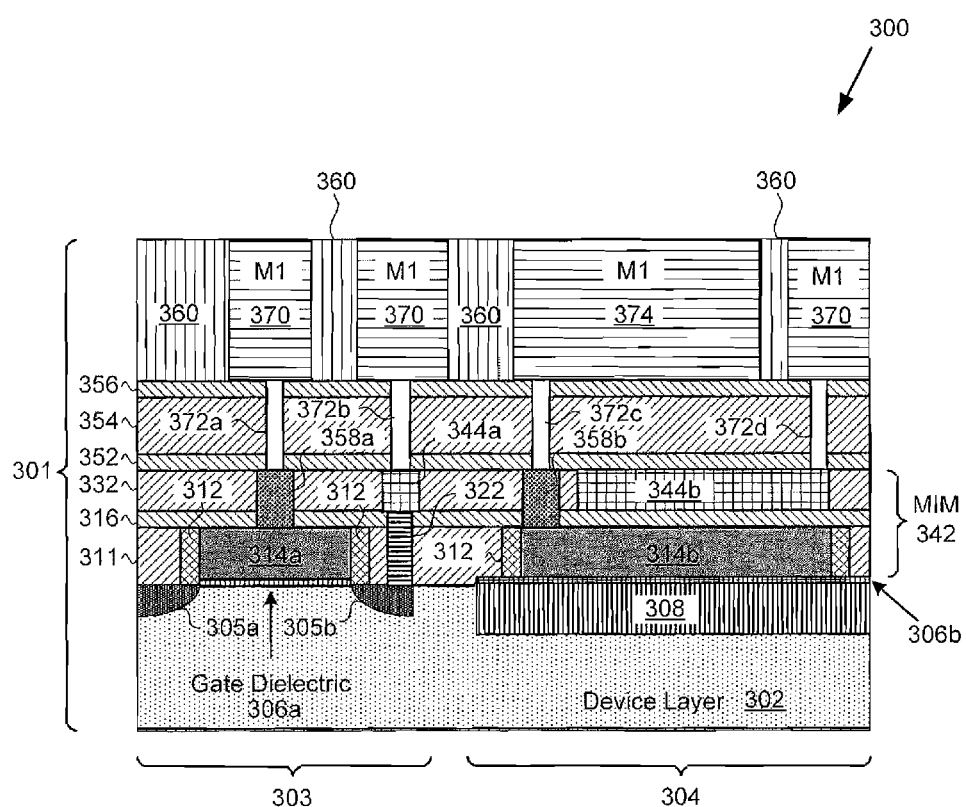
FIG. 3 shows a cross-sectional view of a semiconductor die including a MIM capacitor having a local interconnect metal electrode, according to another embodiment of the present invention, after formation and patterning of a first metallization layer.

It is noted that, although not explicitly shown in FIG. 2A, device layer 202 of semiconductor die 201 is situated below a first metallization layer, such as an "M1" layer of semiconductor die 201 providing routing metallization. FIGS. 2E and 3, which depict embodiments of the present invention at a fabrication stage after formation of a first metallization layer, show the relative positions of device layer 202 and a first metallization layer within semiconductor die 201.

Continuing to refer to FIG. 2A with further reference to flowchart 100, in FIG. 1, step 110 of flowchart 100 comprises forming bottom capacitor electrode 214b from a gate metal over device layer 202 of semiconductor die 201, and forming interlayer barrier dielectric 216 over bottom capacitor electrode 214b. As shown in FIG. 2A, bottom capacitor electrode 214b, as well as metal gate 214a, gate dielectric layers 206a and 206b, and insulating bodies 212 are formed in interlayer dielectric 211. Interlayer dielectric 211 may comprise a layer of $SiO_2$ or silicon nitride ($Si_3N_4$) having a thickness of approximately two hundred angstroms (200 Å) to approximately 2000 Å, for example, while insulating bodies 212 may comprise $SiO_2$, $Si_3N_4$, or any other suitable dielectric material.

According to the embodiment shown in FIG. 2A, metal gate 214a and bottom capacitor electrode 214b are formed over respective gate dielectric layers 206a and 206b. As shown in FIG. 2A, gate dielectric layer 206a is situated over FET region 203 of device layer 202, while gate dielectric layer 206b is disposed over isolation region 208 in MIM capacitor region 204. Gate dielectric layers 206a and 206b can be formed concurrently of the same gate dielectric material. For example, a high dielectric constant (high-κ) gate dielectric layer suitable for use as a gate dielectric for an n-channel FET (NFET) or p-channel FET (PFET) device fabricated in FET region 203 may be used to form each of gate dielectric layers 206a and 206b. That is to say, gate dielectric layers 206a and 206b can comprise, for example, a metal oxide such as hafnium oxide ($HfO_2$), zirconium oxide ($ZrO_2$), or the like. Moreover, gate dielectric layers 206a and 206b can be formed, for example, by depositing a high-κ dielectric material, such as $HfO_2$ or $ZrO_2$, over device layer 202 by utilizing a physical vapor deposition (PVD) process, a chemical vapor deposition (CVD) process, or other suitable deposition process.

In addition, bottom capacitor electrode 214b can be formed concurrently with metal gate 214a, and both metal gate 214a bottom capacitor electrode 214b and can be formed from the same gate metal. In one embodiment, metal gate 214a and bottom capacitor electrode 214b can comprise a gate metal suitable for use as an NFET gate. For example, metal gate 214a and bottom capacitor electrode 214b can each comprise tantalum (Ta), tantalum nitride (TaN), titanium nitride (TiN), or other gate metal suitable for utilization in an NFET gate. Alternatively, when metal gate 214a is fabricated as part of a PFET, metal gate 214a and bottom capacitor electrode 214b can comprise a gate metal suitable for use as an PFET gate, such as molybdenum (Mo), ruthenium (Ru), tantalum carbide nitride (TaCN), for example. Metal gate 214a and bottom capacitor electrode 214b can be formed, for example, by depositing a gate metal layer over gate dielectric layers 206a and 206b to a thickness of from approximately 200 Å to approximately 2000 Å, for example, by utilizing a PVD process, a CVD process, or other deposition process. It is noted that although the present embodiment shows bottom capacitor electrode 214b as being formed over gate dielectric layer 206b, in some embodiments, gate dielectric layer 206b may be omitted and bottom capacitor electrode 214b may be formed on isolation region 208.

As further shown in FIG. 2A, interlayer barrier dielectric 216 is formed over interlayer dielectric 211, insulating bodies 212, metal gate 214a, and bottom capacitor electrode 214b. Interlayer barrier dielectric 216 overlying bottom capacitor electrode 214b may comprise a relatively thin $Si_3N_4$ or $SiO_2$ layer having a thickness of a few hundred angstroms, for example, formed as a blanket layer over interlayer dielectric 211, insulating bodies 212, metal gate 214a, and bottom capacitor electrode 214b. The result of step 110 of flowchart 100 is illustrated by structure 210 in FIG. 2A.

Figure 2B:
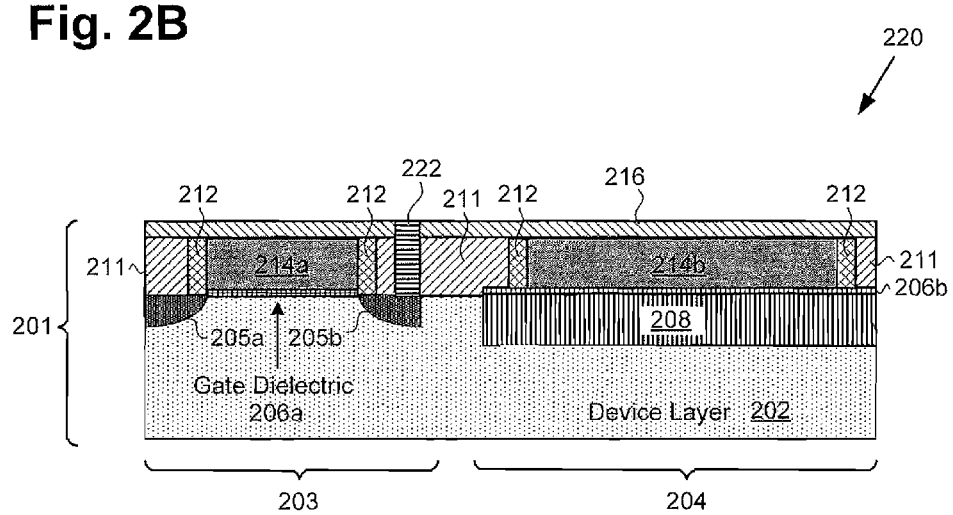
FIG. 2B shows a cross-sectional view, which includes a portion of a semiconductor die processed according to an embodiment of the present invention, corresponding to an intermediate step in the flowchart in FIG. 1.

Continuing to step 120 in FIG. 1 and referring to structure 220 in FIG. 2B, step 120 of flowchart 100 comprises forming a first local interconnect metal body over a transistor source/drain region formed in device layer 202. Step 120 corresponds to formation of local interconnect metal body 222, shown in FIG. 2B. As further shown in FIG. 2B, first local interconnect metal body 222 is situated over and makes contact with source/drain region 205b adjacent metal gate 214a. As may be apparent from FIG. 2B, source/drain regions 205a and 205b and metal gate 214a are formed in FET region 203 of device layer 202. Thus, it may be understood that metal gate 214a and source/drain regions 205a and 205b are comprised by a transistor, such that source/drain regions 205a and 205b serve as transistor source/drain regions. Moreover, first local interconnect metal body 222 may be implemented to serve as a source/drain contact for the transistor comprising metal gate 214a and source/drain regions 205a and 205b.

First local interconnect metal body 222 is formed from a first local interconnect metal. For the purposes of the present application, the feature "local interconnect metal" refers to a metal utilized to form short distance connections between and among devices formed in device layer 202, as well as to facilitate vertical connection of such devices to an overlying first metallization layer, such as routing metallization layer, through one or more vias. A local interconnect metal may comprise copper (Cu), for example, or a refractory metal such as Tungsten (W). Thus, first local interconnect metal body 222 may comprise copper or tungsten, for instance, and can be formed by, for example, by appropriately patterning interlayer barrier dielectric 216 and interlayer dielectric 211. During the patterning process, which can include a masking step and an etch step, a portion of interlayer barrier dielectric 216 and a corresponding portion of interlayer dielectric 211 can be removed to expose source/drain region 205b. First local interconnect metal body 222 may then be formed in the opening produced thereby using any suitable deposition technique. The result of step 120 of flowchart 100 is illustrated by structure 220 in FIG. 2B.

Figure 2C:
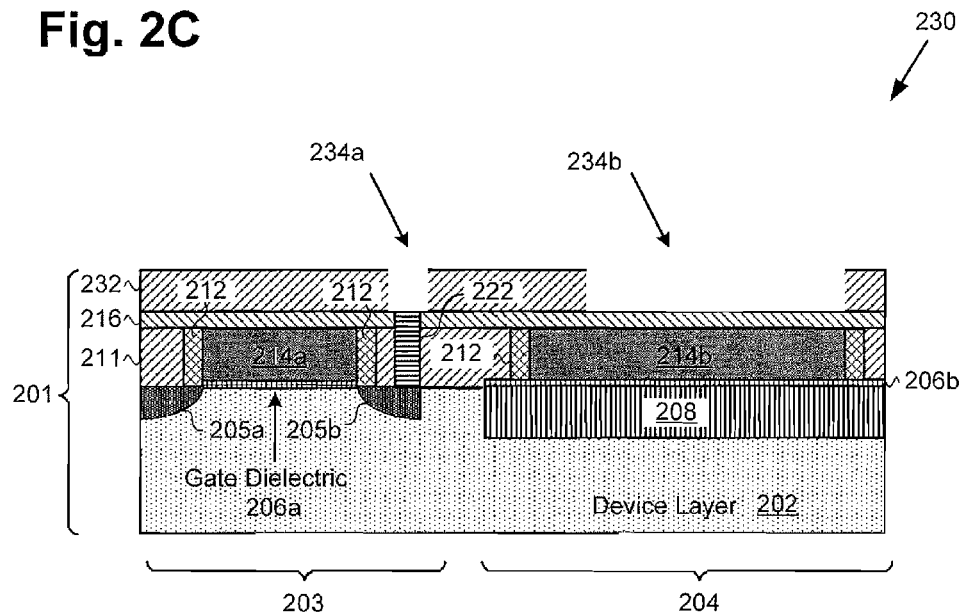
FIG. 2C shows a cross-sectional view, which includes a portion of a semiconductor die processed according to an embodiment of the present invention, corresponding to an intermediate step in the flowchart in FIG. 1.

Moving to step 130 in FIG. 1 and referring to structure 230 in FIG. 2C, step 130 of flowchart 100 comprises forming interlayer dielectric 232 over interlayer barrier dielectric 216, and etching interlayer dielectric 232 to form windows 234a and 234b, respectively, for a source/drain connection and a top capacitor electrode. In one embodiment, interlayer dielectric 232 can comprise the same dielectric material as interlayer dielectric 211, and thus may comprise a blanket $SiO_2$ or $Si_3N_4$ layer having a thickness of approximately 200 Å to approximately 2000 Å, for example. Interlayer dielectric 232 can be formed, for example, by utilizing a CVD process or other deposition process to deposit a layer of dielectric material, such as $SiO_2$, over interlayer barrier dielectric 216 and first local interconnect metal body 222.

Windows 234a and 234b may be formed by, for example, appropriately patterning interlayer dielectric 232. During such a patterning process, which can include a masking step and an etch step, portions of interlayer dielectric 232 can be removed to open window 234a for formation of a source/drain connection and to open window 234b for formation of a top capacitor electrode. It is noted that unlike the etching process used in conjunction with formation of first local interconnect metal body 222, which included etching through interlayer barrier dielectric 216 and interlayer dielectric 211, the etch performed as part of step 130 treats interlayer barrier dielectric 216 as an etch stop surface. Thus, after performance of step 130, window 234a exposes a top surface of first local interconnect metal body 222, while window 234b exposes a portion of interlayer barrier dielectric 216 formed over bottom capacitor electrode 214b. The result of step 130 of flowchart 100 is illustrated by structure 230 in FIG. 2C.

Figure 2D:
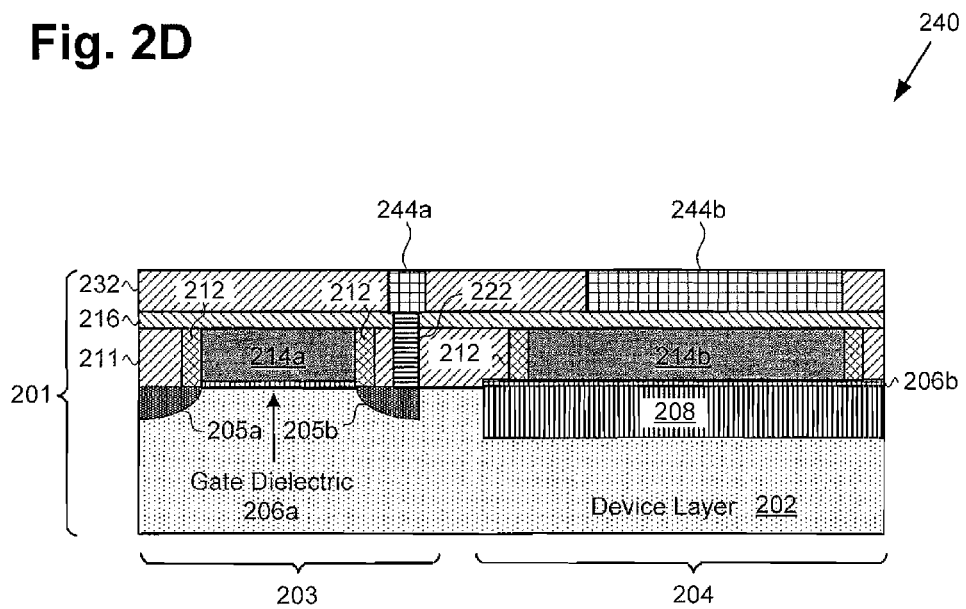
FIG. 2D shows a cross-sectional view, which includes a portion of a semiconductor die processed according to an embodiment of the present invention, corresponding to an intermediate step in the flowchart in FIG. 1.

Continuing to step 140 in FIG. 1 and referring to structure 240 in FIG. 2D, step 140 of flowchart 100 comprises forming source/drain connection 244a and top capacitor electrode 244b using a second local interconnect metal. As shown in FIG. 2D, performance of step 140 produces source/drain connection 244a formed over and in electrical contact with first local interconnect metal body 222 serving as a source/drain contact for the transistor comprising metal gate 214a and source/drain regions 205a and 205b. It is noted that source/drain connection 244a may be formed so as to connect first local interconnect metal body 222 serving as the source/drain contact for source/drain region 205b to source drain contacts for other devices formed in semiconductor die 201.

In addition, performance of step 140 produces top capacitor electrode 244b formed over bottom capacitor electrode 214b and separated from bottom capacitor electrode 214b by interlayer barrier dielectric 216. Top capacitor electrode 244b can be formed concurrently with source/drain connection 244a, for example, and can be formed using the same local interconnect metal, which may comprise Cu or a refractory metal such as W. Moreover, source/drain connection 244a and top capacitor electrode 244b can be formed to have substantially the same thickness, such as a thickness ranging from approximately 200 Å to approximately 2000 Å, for example. The result of step 140 of flowchart 100 is illustrated by structure 240 in FIG. 2D.

Referring now to FIG. 2E, structure 200E shows a cross-sectional view of semiconductor die 201 including MIM capacitor 242 having local interconnect metal top capacitor electrode 244b, according to one embodiment of the present invention, after formation and patterning of a first routing metallization layer. In addition to the features described by reference to FIGS. 2A, 2B, 2C, and 2D, structure 200E in FIG. 2E is shown to include additional interlayer dielectric layers 252, 254, and 256, local interconnect metal bodies 258a and 258b formed from a third local interconnect metal, contact vias 272a, 272b, 272c, and 272d (hereinafter "contact vias 272a-272d"), first metallization segments 270, and isolation bodies 260.

Interlayer dielectrics 252, 254, and 256 may comprise blanket layers of a suitable dielectric material such as $SiO_2$ or $Si_3N_4$, for example. In one embodiment, interlayer dielectrics 252, 254, and 256 may comprise alternating layers corresponding respectively to interlayer barrier dielectric 216 and interlayer dielectric 211. That is to say, in one embodiment, an interlayer dielectric stack comprising interlayer dielectric 211, interlayer barrier dielectric 216, and interlayer dielectrics 232, 252, 254, and 256 may comprise alternating layers of $SiO_2$ and $Si_3N_4$.

Local interconnect metal bodies 258a and 258b formed from a third local interconnect metal may be used to provide gate metal contacts for connecting metal gate 214a and bottom capacitor electrode 214b of MIM capacitor 242 to first metallization segments 270. Vertical contacts for connecting metal gate 214a, source/drain region 205b, bottom capacitor electrode 214b, and top capacitor electrode 244b of MIM capacitor 242 to first metallization segments 270 can be formed in interlayer dielectrics 252, 254, and 256 by etching respective contact vias 272a-272d in interlayer dielectrics 252, 254, and 256 and filling contact vias 272a-272d with tungsten or other metal or metal stack as is known in the art. First metallization segments 270 can comprise, for example, a metal such as aluminum or copper and can be formed by depositing and patterning a first metallization layer over interlayer dielectrics 252, 254, and 256 in a manner known in the art.

As previously discussed, "local interconnect metal" refers to a metal utilized to form short distance connections between and among devices formed in device layer 202, as well as to facilitate vertical connection of such devices to an overlying first metallization layer through one or more vias. In one embodiment, for example, the first, second, and third local interconnect metals may serve specific functions at a particular technology node. For example, at the 20.0 nanometer (20 nm) node, first and second local interconnect metals, such as those used respectively to form first local interconnect metal body 222 and source/drain contact 244a, may typically be utilized in a middle-of-the-line (MEOL) process to provide source/drain connections for devices formed in device layer 202. According to embodiments of the present invention, however, at least one of those first and second local interconnect metals, e.g., the second local interconnect metal used to form source/drain connection 244a, can additionally be advantageously used to fabricate top capacitor dielectric 244b. Moreover, a third local interconnect metal typically used substantially exclusively in an MEOL process as a gate contact for devices formed in device layer 202 at the 20 nm node, e.g., the third local interconnect metal used to form local interconnect metal bodies 258a and 258b, can be further advantageously recruited to serve as a bottom capacitor electrode contact due to fabrication of bottom capacitor electrode 214b from a gate metal suitable for use in fabricating metal gate 214a.

Also, as shown in FIG. 2E, MIM capacitor 242 is situated between the first metallization layer patterned to form first metallization segments 270 (e.g., a first routing metallization layer of semiconductor die 201 formed during back-end-of-line (BEOL) processing) and device layer 202. Thus, both the lower and upper electrodes of MIM capacitor 242 are formed below the first metallization layer in the semiconductor die. Furthermore, by utilizing a gate metal for a bottom MIM capacitor electrode, and utilizing a local interconnect metal for a top MIM capacitor electrode, the process for forming an embodiment of MIM capacitor 242 is compatible with a high-κ metal gate process for advanced process technologies, such as 20 nm and smaller complementary metal-oxide-semiconductor (CMOS) process technologies, for example. Also, by situating MIM capacitor 242 over MIM capacitor region 204 of device layer 202, an embodiment of the invention's MIM capacitor 242 can provide a capacitance density greater than approximately 2.0 femtofarads per square micrometer (fF/um$^2$), such as approximately 2.2 fF/um$^2$ thereby advantageously increasing capacitance density without substantially degrading the performance of devices, such as CMOS logic devices, fabricated in device layer 202 when compared to conventional MIM capacitors formed between metallization layers in a semiconductor die during BEOL processing.

Turning now to FIG. 3, structure 300 shows a cross-sectional view of semiconductor die 301 including MIM capacitor 342 having local interconnect metal top capacitor electrode 344b, according to another embodiment of the present invention, after formation and patterning of a first metallization layer. Semiconductor die 301 comprises device layer 302 including FET region 303 in which source/drain regions 305a and 305b are formed and MIM capacitor region 304 in which isolation region 308 is formed, corresponding to device layer 202 including FET region 203 in which source/drain regions 205a and 205b are formed and MIM capacitor region 204 in which isolation region 208 is formed, in FIG. 2E. Structure 300, in FIG. 3, further includes interlayer barrier dielectric 316, interlayer dielectrics 311, 332, 352, 354, and 356, gate dielectric layers 306a and 306b, metal gate 314a, insulating bodies 312, local interconnect metal bodies 322, 358a, and 358b, source/drain connection 344a, contact vias 372a, 372b, 372c, and 372d (hereinafter "contact vias 372a-372d"), first metallization segments 370, and isolation bodies 360, corresponding respectively to interlayer barrier dielectric 216, interlayer dielectrics 211, 232, 252, 254, and 256, gate dielectric layers 206a and 206b, metal gate 214a, insulating bodies 212, local interconnect metal bodies 222, 258a, and 258b, source/drain connection 244a, contact vias 272a-272, first metallization segments 270, and isolation bodies 260, in FIG. 2E.

In addition, structure 300 comprise MIM capacitor 342 including bottom capacitor electrode 314b formed from a gate metal, a capacitor dielectric provided by interlayer barrier dielectric 316, and top capacitor electrode 344b formed from the same local interconnect metal used to form source/drain connection 344a. MIM capacitor 342 including bottom capacitor electrode 314b, interlayer barrier dielectric 316, and top capacitor electrode 344b corresponds to MIM capacitor 242 including bottom capacitor electrode 214b, interlayer barrier dielectric 216, and top capacitor electrode 244b, in FIG. 2E. Also shown in FIG. 3 is metal plate 374 formed from the first metallization layer used to form first metallization segments 370.

According to the embodiment shown in FIG. 3, metal plate 374 is formed over top capacitor electrode 344b. Metal plate 374 may be formed substantially concurrently with first metallization segments 370 through an appropriate patterning process performed on the first metallization layer. That is to say, in one embodiment, the method of flowchart 100, in FIG. 1, can include an additional step of forming metal plate 374 in a first routing metallization layer formed over top capacitor electrode 344b in a BEOL process. As shown in FIG. 3, metal plate 374 extends over a substantial portion of top capacitor electrode 344b while being electrically connected to bottom capacitor electrode 314b through contact via 372c and local interconnect metal body 358b, thereby further increasing the capacitance density of MIM capacitor 342 compared to MIM capacitor 242, in FIG. 2E.

Thus, as discussed above, the present invention provides a MIM capacitor that utilizes gate metal for a bottom capacitor electrode, an interlayer barrier dielectric, such as $Si_3N_4$, as a capacitor dielectric, and utilizes a local interconnect metal, such as Cu or W, for example, to form a top capacitor electrode. As a result, embodiments of the present MIM capacitor can be advantageously formed concurrently with NFET and PFET gate stacks without requiring substantial additional processing steps beyond those required to form NFET and PFET gate stacks. By avoiding such additional processing steps, embodiments of the present invention provide a MIM capacitor that can be fabricated at a significantly lower cost compared to a conventional MIM capacitor fabricated between routing metallization layers in a semiconductor die during BEOL processing. In addition, embodiments of the present invention provide a MIM capacitor having an increased capacitance density compared to that achieved by conventional MIM capacitors fabricated between routing metallization layers during BEOL processing.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A metal-insulator-metal (MIM) capacitor in a semiconductor die, said MIM capacitor comprising:
    a bottom capacitor electrode over a device layer situated below a first metallization layer of said semiconductor die, the device layer including elements of a device;
    an interlayer barrier dielectric layer having a first portion formed over the bottom capacitor electrode and a second portion formed over the device;
    a top capacitor electrode disposed over the interlayer barrier dielectric layer;
    a first local interconnect metal that directly connects to at least one element of the device in the device layer without obstruction from any element used to form the bottom capacitor electrode or the interlayer barrier dielectric layer of the MIM capacitor such that the first local interconnect metal terminates after penetrating the second portion of the interlayer barrier dielectric layer; and
    a metal electrode layer having at least a first portion and a second portion, the first portion being said top capacitor electrode and the second portion being a second local interconnect metal that is disposed above the second portion of the interlayer barrier dielectric layer and directly connects to the first local interconnect metal.

2. The MIM capacitor of claim 1, wherein said bottom capacitor electrode is formed from a gate metal layer formed over said device layer.

3. The MIM capacitor of claim 1, wherein said local interconnect metal comprises tungsten.

4. The MIM capacitor of claim 1, wherein said local interconnect metal comprises copper.

5. The MIM capacitor of claim 1, wherein said local interconnect metal is used for connecting source/drain contacts of said devices formed in said device layer.

6. The MIM capacitor of claim 1, wherein said interlayer barrier dielectric comprises silicon nitride.

7. The MIM capacitor of claim 1, wherein said bottom capacitor electrode is formed over an isolation region formed in said device layer.

8. The MIM capacitor of claim 1, further comprising a metal plate formed in said first metallization layer and over said top capacitor electrode, said metal plate being connected to said bottom capacitor electrode to provide an increased capacitance density.

9. The MIM capacitor of claim 1, wherein said MIM capacitor achieves a capacitance density of greater than approximately 1.5 fF/$\mu$m$^2$.

10. The MIM capacitor of claim 1, wherein said MIM capacitor achieves a capacitance density of greater than approximately 2.0 fF/$\mu$m$^2$.

\* \* \* \* \*